United States Patent

Yamamoto et al.

(10) Patent No.: US 10,763,171 B2
(45) Date of Patent: Sep. 1, 2020

(54) METHOD OF MANUFACTURING SEMICONDUCTOR APPARATUS

(71) Applicant: OKAMOTO MACHINE TOOL WORKS, LTD., Gunma (JP)

(72) Inventors: Eiichi Yamamoto, Gunma (JP); Takahiko Mitsui, Gunma (JP)

(73) Assignee: OKAMOTO MACHINE TOOL WORKS, LTD., Gunma (JP)

( * ) Notice: Subject to any disclaimer, the term of this patent is extended or adjusted under 35 U.S.C. 154(b) by 0 days.

(21) Appl. No.: 16/268,955

(22) Filed: Feb. 6, 2019

(65) Prior Publication Data

US 2019/0244858 A1 Aug. 8, 2019

(30) Foreign Application Priority Data

Feb. 7, 2018 (JP) ................... 2018-019791

(51) Int. Cl.
  *H01L 21/768* (2006.01)
  *H01L 21/762* (2006.01)
  *H01L 25/00* (2006.01)
  *H01L 25/065* (2006.01)

(52) U.S. Cl.
  CPC .... *H01L 21/76898* (2013.01); *H01L 21/7624* (2013.01); *H01L 21/76243* (2013.01); *H01L 21/76831* (2013.01); *H01L 21/76877* (2013.01)

(58) Field of Classification Search
  CPC ......... H01L 21/76898; H01L 21/76831; H01L 21/76877; H01L 21/76243
  See application file for complete search history.

(56) References Cited

U.S. PATENT DOCUMENTS

2018/0286795 A1* 10/2018 Maenosono ............ H01L 24/05

FOREIGN PATENT DOCUMENTS

JP 2015023113 A 2/2015

* cited by examiner

*Primary Examiner* — Marcos D. Pizarro
*Assistant Examiner* — Antonio B Crite
(74) *Attorney, Agent, or Firm* — Rankin, Hill & Clark LLP

(57) ABSTRACT

An embodiment of the present disclosure provides a method of manufacturing a semiconductor apparatus, including the following steps. A) forming a semiconductor device element in a Si active layer of an insulating isolation Si substrate including the Si active layer, a buried insulating layer, and a Si supporting substrate arranged in this order; B) forming a plurality of through electrode holes penetrating the Si active layer and the buried insulating layer to reach a partial region of the Si supporting substrate in an element region layer including the formed semiconductor device element; C) forming a through silicon via by sequentially forming an insulating film, a barrier film, and a Cu film inside the through electrode hole to completely fill the through electrode hole; D) forming a multilayer wiring layer including a wiring layer connected to the semiconductor device element on an outer surface of the element region layer in which the through silicon via is formed; and E) exposing the Cu film of the through silicon via by removing the Si supporting substrate after forming the multilayer wiring layer.

8 Claims, 4 Drawing Sheets

METHOD OF MANUFACTURING SEMICONDUCTOR APPARATUS

CROSS-REFERENCE TO RELATED APPLICATION

This application claims priority from Japanese Patent Application No. 2018-019791 filed with the Japan Patent Office on Feb. 7, 2018, the entire content of which is hereby incorporated by reference.

BACKGROUND

1. Technical Field

The present disclosure relates to a method of manufacturing a semiconductor apparatus.

2. Related Art

For a semiconductor device, it is required to transmit more information more quickly and to be compact and have low power consumption. Conventionally, these requirements and the like have been solved by a technique of miniaturizing the semiconductor device.

However, limitations on miniaturization, and cost increase have become problems. Therefore, as an alternative to miniaturization, the semiconductor device is being three-dimensionally formed by through silicon via (TSV).

For example, JP-A-2015-023113 discloses a method for flattening and grinding a semiconductor substrate with a copper through electrode developed by the present inventors.

SUMMARY

A method of manufacturing a semiconductor apparatus according to an embodiment of the present disclosure includes the following steps: A) forming a semiconductor device element in a Si active layer of an insulating isolation Si substrate including the Si active layer, a buried insulating layer, and a Si supporting substrate arranged in this order; B) forming a plurality of through electrode holes penetrating the Si active layer and the buried insulating layer to reach a partial region of the Si supporting substrate in an element region layer including the formed semiconductor device element; C) forming a through silicon via by sequentially forming an insulating film, a barrier film, and a Cu film inside the through electrode hole to completely fill the through electrode hole; D) forming a multilayer wiring layer including a wiring layer connected to the semiconductor device element on an outer surface of the element region layer in which the through silicon via is formed; and E) exposing the Cu film of the through silicon via by removing the Si supporting substrate after forming the multilayer wiring layer.

DETAILED DESCRIPTION

Figure 1A:
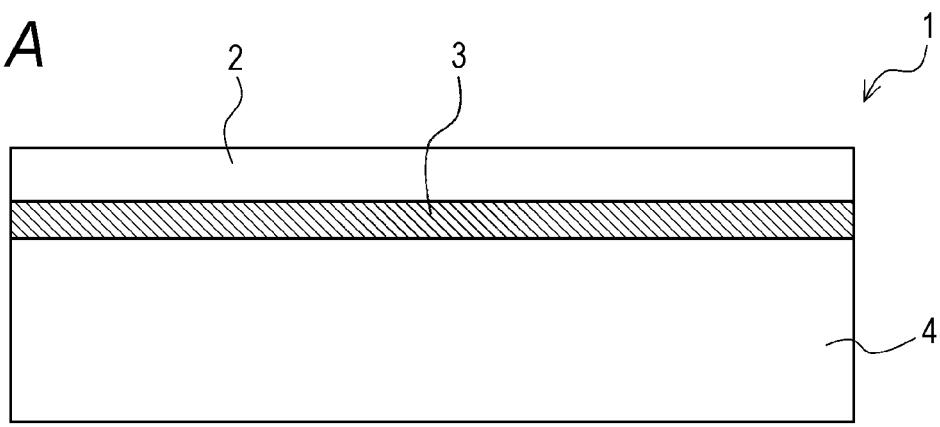
FIG. 1A is a cross-sectional view of an insulating isolation Si substrate used in a method of manufacturing a semiconductor apparatus according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the field of semiconductor apparatuses, in order to realize more three-dimensional multilayered devices (three-dimensional devices), it is necessary to further reduce a thickness of each device wafer, improve inter-device connection stability (yield), and reduce costs. Currently there are many process and structural challenges. Therefore, development is underway both domestically and overseas.

Specifically, a semiconductor device wafer currently has a thickness of 30 to 40 μm. In the future, the semiconductor device wafer is required to have ultra-thin layers of 5 to 20 μm and to have high performance and high multi-layer. In order to realize this ultra-thin layer formation process, a risk of cracking is eliminated during thinning processing and transportation by holding the semiconductor device wafer with a support wafer via a resin.

The support wafer is formed to have approximately the same size as the semiconductor device wafer using silicon (Si) or glass. Then, the support wafer is bonded to the semiconductor device wafer, for example, via the resin of silicon, epoxy, or polyimide.

A back surface of the semiconductor device wafer bonded to the support wafer is thinned by grinding or polishing. The semiconductor device wafer having a thinned back surface is peeled off from an interface of the resin bonded to the support wafer. At this peeling, the risk of cracking occurs.

The resin used for bonding usually has a thickness of 30 to 50 μm. The thickness has in-plane variation of 2 to 3 μm. This variation in thickness of the resin becomes the variation in thickness of the semiconductor device wafer during thinning grinding without change. Therefore, when the semiconductor wafer after thinning grinding has a thickness of about 10 μm, the above-mentioned variation in thickness greatly affects device performance and yield of the semiconductor apparatus. Therefore, the variation in thickness is a major problem that impedes practical use.

In order to eliminate influence of variation in thickness of the resin, the present inventors have proposed a technique to minimize the variation in thickness in a wafer surface by automatically correcting the thickness measured during thinning grinding, as disclosed in JP-A-2015-023113. However, in the method for flattening and grinding a semiconductor substrate disclosed in JP-A-2015-023113, a very advanced grinding device and its algorithm are required.

A method of manufacturing the semiconductor apparatus according to an embodiment of the present disclosure has been developed in view of the above circumstances. The purpose is to eliminate steps of bonding and peeling the support wafer, which were necessary for thinning each device layer in a manufacturing process of the three-dimensional device. This makes it possible to provide the method of manufacturing the semiconductor apparatus capable of suppressing in principle a problem of variation in thickness at the time of bonding, a problem of cracking risk of the device at the time of peeling, and a problem of cost increase by adding these steps.

A method of manufacturing a semiconductor apparatus according an embodiment of the present disclosure includes the following steps: A) forming a semiconductor device element in a Si active layer of an insulating isolation Si substrate including the Si active layer, a buried insulating layer, and a Si supporting substrate arranged in this order; B) forming a plurality of through electrode holes penetrating the Si active layer and the buried insulating layer to reach a partial region of the Si supporting substrate in an element region layer including the formed semiconductor device element; C) forming a through silicon via by sequentially forming an insulating film, a barrier film, and a Cu film inside the through electrode hole to completely fill the through electrode hole; D) forming a multilayer wiring layer including a wiring layer connected to the semiconductor device element on an outer surface of the element region layer in which the through silicon via is formed; and E) exposing the Cu film of the through silicon via by removing the Si supporting substrate after forming the multilayer wiring layer.

The method of manufacturing the semiconductor apparatus of the present disclosure includes the following steps.

a) forming a semiconductor device element in a Si active layer of an insulating isolation Si substrate (SOI substrate: Silicon on Insulator Wafer)

b) forming a plurality of through electrode holes penetrating the Si active layer and the buried insulating layer of the insulating isolation Si substrate to reach a partial region of a Si supporting substrate in an element region layer including the formed semiconductor device element c) forming a through silicon via by sequentially forming an insulating film, a barrier film, and a Cu film in the through electrode hole d) forming a multilayer wiring layer on an outer surface of the element region layer having the formed through silicon via e) exposing the Cu film of the through silicon via by removing the Si supporting substrate after forming the multilayer wiring layer Therefore, it is possible to eliminate the steps of bonding and peeling the support wafer which have been performed in a conventional manufacturing process. That is, a process using a conventional support wafer is not necessary between a series of device processes for forming the semiconductor device element and the multilayer wiring layer, and a process of forming the through silicon via and a process of thinning the device layer.

Thus, it is possible to solve the problem of variation in thickness of the device wafer in the method of manufacturing the semiconductor apparatus due to use of the support wafer. As a result, it is possible to manufacture a thinned high-performance semiconductor device. Then, the risk of cracking and chipping of the device wafer can be avoided. Therefore, the semiconductor device with high yield, that is, low cost can be manufactured.

Further, it is possible to eliminate a conventional bump forming step. Therefore, it is not necessary to form various films for joining materials and the like for forming bumps. This makes it possible to greatly simplify the manufacturing process. At the same time, cost reduction of the semiconductor apparatus can be achieved.

Further, with the method of manufacturing the semiconductor apparatus according to the embodiment of the present disclosure, in step e), the Si supporting substrate may be removed by a grinding method using a diamond grindstone, a combination of the grinding method and a CMP method, or a combination of an etching method and the CMP method. This makes it possible to manufacture the semiconductor device which is thinned, having high performance and high yield.

Further, with the method of manufacturing the semiconductor apparatus according to the embodiment of the present disclosure, a first device layer obtained after step d) may be bonded with a second device layer obtained after step d) using another insulating isolation Si substrate. This makes it possible to bond the first device layer and the second device layer without using the conventional support wafer. As a result, it is possible to manufacture a three-dimensional semiconductor apparatus with high-density, low power consumption, and high-speed at low cost.

Further, with the method of manufacturing the semiconductor apparatus according to the embodiment of the present disclosure, the multilayer wiring layer formed in the second device layer may be bonded to the multilayer wiring layer formed in the first device layer. This makes it possible to bond the first device layer and the second device layer in a state where respective Si supporting substrates are not removed. Therefore, it is possible to realize a processing method of a highly accurate and low-cost three-dimensional semiconductor apparatus with less variation in thickness and less risk of cracking.

Further, with the method of manufacturing the semiconductor apparatus of the embodiment of the present disclosure, after step e) is performed in the second device layer bonded to the first device layer, the multilayer wiring layer of the third device layer obtained after step d) may be bonded to the element region layer having the exposed Cu film in the second device layer using another insulating isolation Si substrate. This makes it possible to manufacture a high-performance three-dimensional semiconductor apparatus having the first device layer, the second device layer, the third device layer, or even a larger number of device layers as required, with high efficiency and low cost.

Figure 1B:
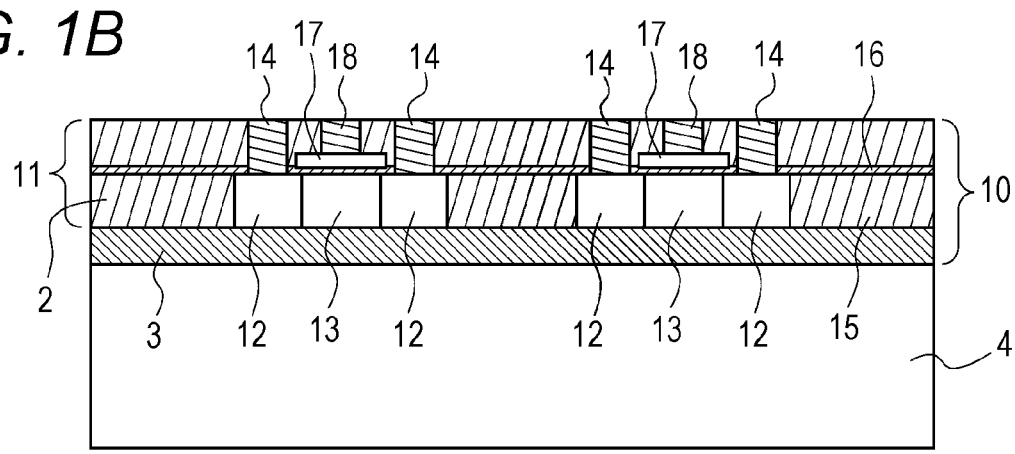
FIG. 1B is a cross-sectional view showing a step of forming a semiconductor device element in the method of manufacturing the semiconductor apparatus according to the embodiment of the present disclosure.
Figure 1C:
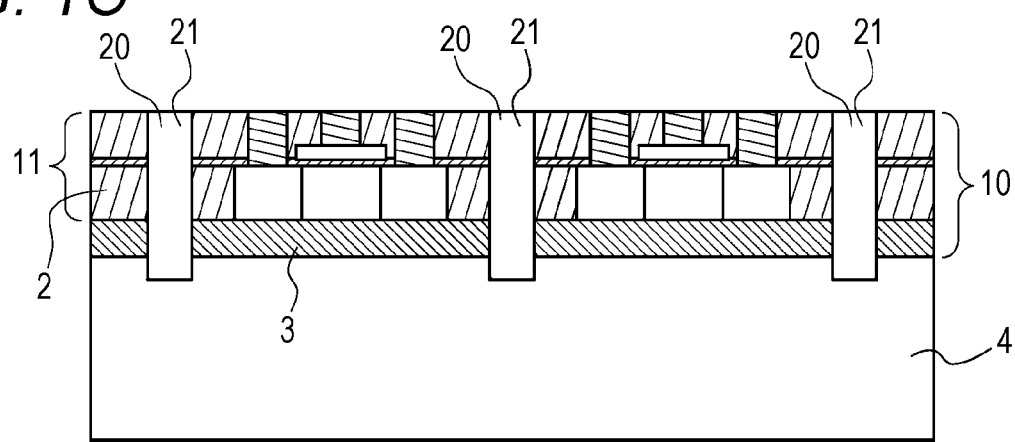
FIG. 1C is a cross-sectional view showing a step of forming a through electrode hole in the method of manufacturing the semiconductor apparatus according to the embodiment of the present disclosure.
Figure 2A:
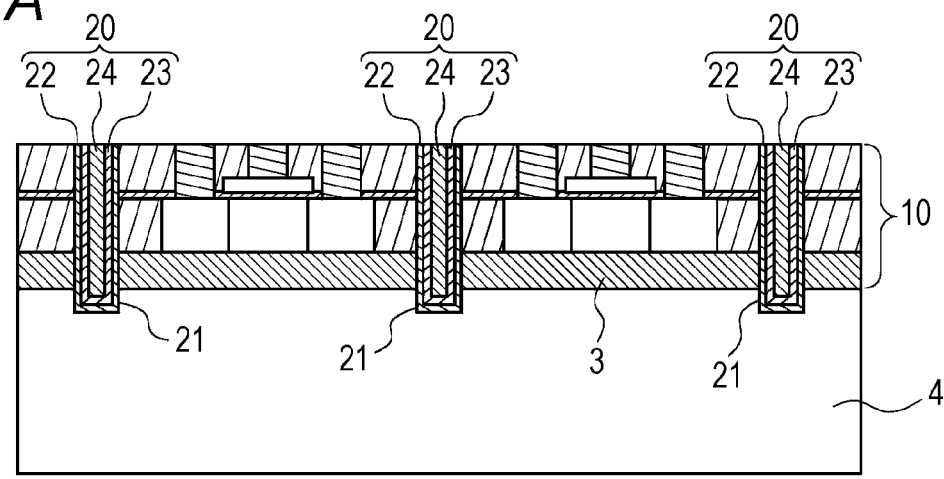
FIG. 2A is a cross-sectional view showing a step of forming a through silicon via in the method of manufacturing the semiconductor apparatus according to the embodiment of the present disclosure.
Figure 2B:
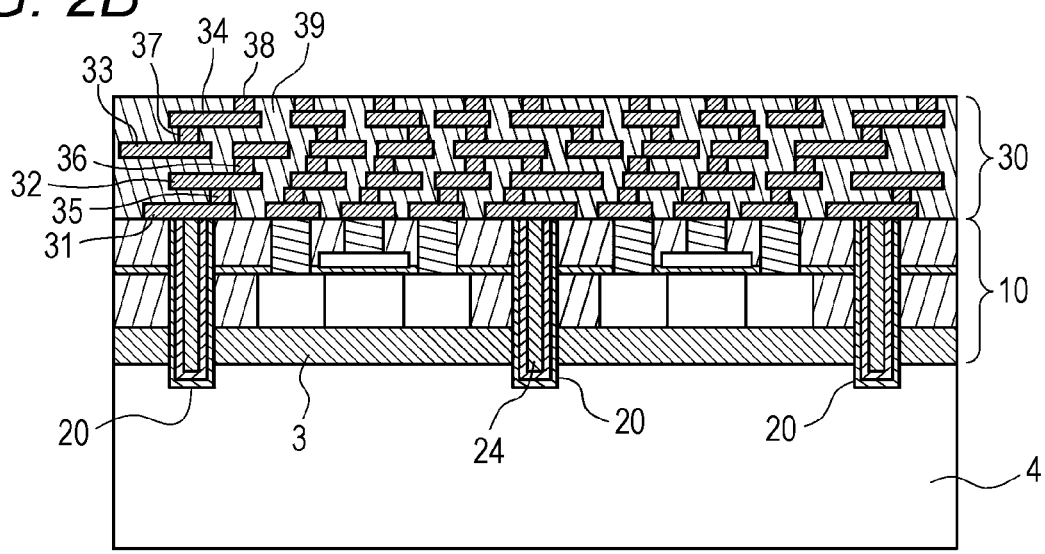
FIG. 2B is a cross-sectional view showing a step of forming a multilayer wiring layer in the method of manufacturing the semiconductor apparatus according to the embodiment of the present disclosure.
Figure 2C:
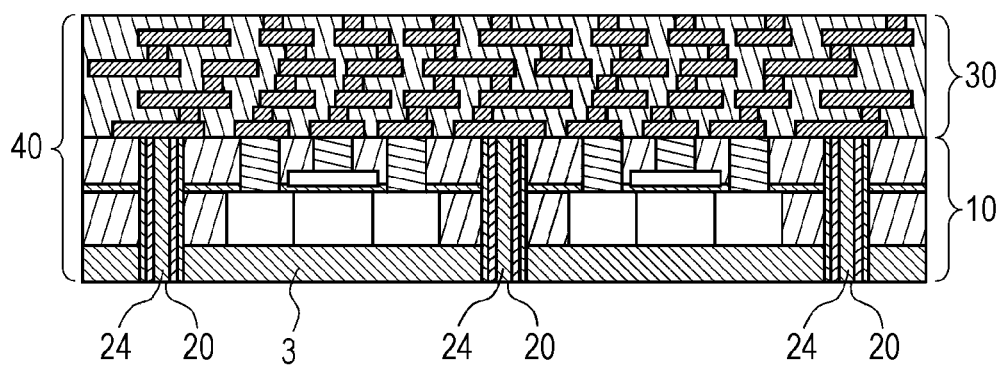
FIG. 2C is a cross-sectional view showing a step of exposing a Cu film in the method of manufacturing the semiconductor apparatus according to the embodiment of the present disclosure.

Hereinafter, the method of manufacturing the semiconductor apparatus according to the embodiment of the present disclosure will be described in detail with reference to the drawings. FIGS. 1A to 1C and FIGS. 2A to 2C are cross-sectional views showing the method of manufacturing the semiconductor apparatus according to the embodiment of the present disclosure. FIG. 1A shows an insulating isolation Si substrate 1 to be a base substrate. FIG. 1B shows a step of forming a semiconductor device element 11 to be an element region layer 10. FIG. 1C shows a step of forming a through electrode hole 21. FIG. 2A shows a step of forming a through silicon via 20. FIG. 2B shows a step of forming a multilayer wiring layer 30. FIG. 2C shows a step of exposing a Cu film 24.

As shown in FIG. 1A, in the method of manufacturing the semiconductor apparatus according to the embodiment of the present disclosure, the insulating isolation Si substrate 1 having a Si active layer 2, a buried insulating layer 3, and a Si supporting substrate 4 is used as the base substrate.

The Si active layer 2 of the insulating isolation Si substrate 1 is a layer for constructing the semiconductor device element 11 (see FIG. 1B) or the like. The Si active layer 2 has a thickness in a range of 1 to 20 μm, preferably in the range of 1 to 5 μm.

The buried insulating layer 3 is an oxide layer or the like for separating the Si active layer 2 from the Si supporting substrate 4. The buried insulating layer 3 is formed between the Si active layer 2 and the Si supporting substrate 4. Further, the buried insulating layer 3 is a layer for separating the element region layer 10 (see FIG. 1B) from another device or the like bonded on its opposite side, when the element region layer 10 (see FIG. 1B) formed on the Si active layer 2 side is bonded to another device layer or the like after the Si supporting substrate 4 is cut off.

The buried insulating layer 3 is generally formed of $SiO_2$. In order to improve ion stopping power, SiN or SiBNO may be used as a material of the buried insulating layer 3. Alternatively, the buried insulating layer 3 may have a layered structure of $SiO_2$/SiN or the like. The buried insulating layer 3 may have a thickness of, for example, 500 nm. Alternatively, the buried insulating layer 3 may have a thickness selected from the range of 100 to 2,000 nm, from requirements on characteristics of the device layer or the like to be separated.

The Si supporting substrate 4 is used to support the element region layer 10 or the like in each step of the method of manufacturing the semiconductor apparatus according to the present embodiment. The Si supporting substrate 4 to be used has a thickness of, for example, 720 μm. Note that the Si supporting substrate 4 to be used may have a thickness in the range of 600 to 800 μm as a thickness required for proceeding each step.

As shown in FIG. 1B, step a) of forming the semiconductor device element 11 is a step of forming various devices mainly including transistors and the like in the Si active layer 2. Step a) mainly includes a step of forming an element isolation insulating layer 15, a step of forming a channel region 13, a step of forming a gate insulating layer 16, a step of forming a gate polysilicon electrode layer 17, a step of forming a source/drain region 12, a step of forming a source/drain electrode layer 14, and a step of forming a gate electrode layer 18. Through the series of steps, the element region layer 10 including the semiconductor device element 11 formed on an upper surface of the buried insulating layer 3 is formed.

Various patterns of the semiconductor device element 11 are formed by an ArF excimer laser stepper. The element isolation insulating layer 15 is formed by a high-temperature CVD method. The gate insulating layer 16 is formed by a thermal oxidation method. Further, the channel region 13 and the source/drain region 12 are formed by an ion implantation method. The gate polysilicon electrode layer 17, the source/drain electrode layer 14, and the gate electrode layer 18 are formed by a CVD method.

Next, as shown in FIG. 1C, the through electrode hole 21 is formed in step b). In step b), a fluorine-based gas is used by RIE (reactive ion etching) technology. The element region layer 10 is processed so as to have the through electrode hole 21 substantially perpendicular to the element region layer 10.

Specifically, the through electrode hole 21 penetrating the element region layer 10 having the formed semiconductor device element 11 to reach an upper surface of the Si supporting substrate 4 is formed. The through electrode hole 21 is a via hole for forming the through silicon via 20. The through electrode hole 21 penetrates the Si active layer 2 and the buried insulating layer 3 of the insulating isolation Si substrate 1 (see FIG. 1A) to reach an inside of the Si supporting substrate 4 at a depth of about 1 μm from the buried insulating layer 3 side.

Next, as shown in FIG. 2A, the through silicon via 20 is formed in step c). In step c), an insulating film 22 for insulating isolation is first formed so as to cover an inner surface of the through electrode hole 21 opening on an upper surface side of the element region layer 10. The insulating film 22 is formed to have a thickness of about 300 nm by, for example, the CVD method.

Then, a barrier film 23 is formed inside the insulating film 22 as a film for preventing Cu contamination due to the through silicon via 20. The barrier film 23 is a layer, for example, containing a TiN layer or a TaN layer and having a thickness of about 30 nm. The barrier film 23 is formed by a sputtering method.

Further, the Cu film 24 is formed inside the barrier film 23. The Cu film 24 is formed to have a thickness of about 50 nm by, for example, the sputtering method. Then, the Cu film 24 is formed by an electroplating method so that whole inside of the through electrode hole 21 is filled with the Cu film. The Cu film 24, the barrier film 23, and the insulating film 22 formed on an upper surface of the element region layer 10 other than the through electrode hole 21 are removed by the CMP method.

Next, as shown in FIG. 2B, the multilayer wiring layer 30 is formed in step d). The multilayer wiring layer 30 is formed with a plurality of wiring layers, for example, four wiring layers including a first wiring layer 31, a second wiring layer 32, a third wiring layer 33, and a fourth wiring layer 34. In an example of FIG. 2B, the multilayer wiring layer 30 is a multilayer wiring region including the four wiring layers formed inside a wiring interlayer insulating layer 39. The number and shape of wiring layers forming the multilayer wiring layer 30 are not limited to the above example. For example, the number of stacked wiring layers may be 3 to 10 layers or more.

The multilayer wiring layer 30 is formed by, for example, a damascene method or a dual damascene method. First, the first wiring layer 31 surrounded by the wiring interlayer insulating layer 39 is formed to cover the upper surface of the element region layer 10.

Specifically, resist patterning is performed by an ArF stepper. A groove is processed and produced by RIE method using CF4-based gas. Thereafter, the barrier film 23 is formed by the sputtering method. Then, the through electrode hole 21 is filled with the Cu film 24 by electroplating. Finally, the Cu film 24 and the barrier film 23, which are formed outside the groove and unnecessary, are removed by polishing by the CMP method. In this way, the first wiring layer 31 is completed.

Further, a first via layer 35 may be formed on an upper surface of the first wiring layer 31 by substantially the same steps as described above. The multilayer wiring layer 30 including the first wiring layer 31, the second wiring layer 32, the third wiring layer 33, and the fourth wiring layer 34 is formed by repeating the above steps.

Note that the second wiring layer 32 and a second via layer 36 may be formed by the dual damascene method capable of simultaneously filling the wiring layer and the via layer with the Cu film. The same applies to the third wiring layer 33 and a third via layer 37, and also to the fourth wiring layer 34 and a fourth via layer 38. This makes it possible to shorten the step of forming the multilayer wiring layer 30.

Next, as shown in FIG. 2C, step e) of exposing the Cu film 24 (TSV via Cu) of the through silicon via 20 is performed. Specifically, the Si supporting substrate 4 (see FIG. 2B) located below a device layer 40 including the element region layer 10 and the multilayer wiring layer 30 is removed by the grinding method or the like. In this way, the Cu film 24 is exposed.

Grinding of the Si supporting substrate 4 includes two steps of rough grinding and finish grinding. A vitrified bonded #500 diamond grindstone is used in the rough grinding. Then, processing is performed under conditions of a diamond grindstone feed rate of 200 µm/min, a grindstone rotation speed of 2000 min$^{-1}$, and a wafer rotation speed of 300 min$^{-1}$. Thus, the Cu film 24 is removed until a portion left inside the element region layer 10 has a thickness of 50 µm.

In the finish grinding, the Cu film 24 and the buried insulating layer 3 of the through silicon via 20 are exposed during the grinding. Therefore, the grinding method is performed while injecting high-pressure water onto the grindstone. Specifically, a vitrified bonded #8000 diamond grindstone is used. Then, the processing is performed under the conditions of the feed rate of 20 µm/min, the grindstone rotation speed of 3000 min$^{-1}$, and the wafer rotation speed of 300 min$^{-1}$.

The finish grinding is carried out until the Si supporting substrate 4 is completely removed. By the finish grinding, surface roughness of the buried insulating layer 3 is about 3 nm (Ra). That is, a highly accurate device layer 40 is obtained.

Conditions of the rough grinding and the finish grinding are not limited to the above conditions. There are optimum conditions for the rough grinding and the finish grinding depending on a state and a grit of the grindstone. At the same time, it is possible to adjust an ejection pressure of the high-pressure water so as to suitably correspond to a Cu density of the through silicon via 20.

In the above example, the through silicon via 20 with the Cu density of 10% is processed at the ejection pressure of 6 MPa which is an optimum value in combination with the #8000 grindstone. The grinding may be performed under a suitable condition that is obtained on an assumption that there is the optimum value on a lower ejection pressure side when the Cu density is low and on a higher ejection pressure side when the Cu density is high. Further, the grinding may be performed under the suitable condition that is obtained on the assumption that there is the optimum value on the lower ejection pressure side when the grindstone has a high grit and on the higher ejection pressure side when the grindstone has a low grit.

Further, in the above embodiment, an example is shown in which all Si supporting substrates 4 are removed by the grinding method. However, in the present embodiment, it is also possible to manufacture the semiconductor apparatus having the same structure by the combination of the grinding method and the CMP method, or a combination of a mixed acid etching method and the CMP method.

Specifically, in step e) of removing the Si supporting substrate 4, a method of removing all the Si supporting substrates 4 by a grinding technique using fixed abrasive grains may be used. Further, after roughly removing the Si supporting substrate 4 by the grinding technique using fixed abrasive grains, a method of completely removing the remaining Si supporting substrate 4 by a CMP technique using free abrasive grains may be used. Furthermore, after roughly removing the Si supporting substrate 4 by mixed acids (for example, a mixed solution of hydrofluoric acid, nitric acid and acetic acid), the method of completely removing the remaining Si supporting substrate 4 by the CMP technique using free abrasive grains may be used. It is possible to manufacture the semiconductor device which is thinned, having high performance and high yield by removing the Si supporting substrate 4 by these methods.

With the above-described method of manufacturing the semiconductor apparatus according to the present embodiment described with reference to FIGS. 1 and 2, it is possible to eliminate the bonding and peeling steps of the support wafer which have been performed in the conventional manufacturing process. That is, it is not necessary to perform the process using the conventional support wafer between the series of device processes for forming the element region layer 10 including the semiconductor device element 11 and the multilayer wiring layer 30, and the process of forming the through silicon via 20 and the process of thinning the device layer 40.

This makes it possible to eliminate the problem of variation in thickness of the device wafer in the method of manufacturing the semiconductor apparatus in which the support wafer is used. As a result, it is possible to manufacture the thinned high-performance semiconductor device. Then, the risk of cracking and chipping of the device wafer can be avoided. Therefore, the low-cost semiconductor device with high yield can be manufactured.

Further, it is possible to eliminate the conventional bump forming step. Therefore, it is not necessary to form various films for joining materials and the like for forming bumps. This makes it possible to greatly simplify the manufacturing process. At the same time, cost reduction of the semiconductor apparatus can be achieved.

Next, the method of manufacturing the semiconductor apparatus (three-dimensional semiconductor apparatus) including a three-dimensional semiconductor device will be described in detail with reference to FIGS. 3 and 4. Note that the same reference numerals are given to constituent elements which have the same or similar functions or effects as the manufacturing method of the above-described embodiments, and description thereof will be omitted.

Figure 3:
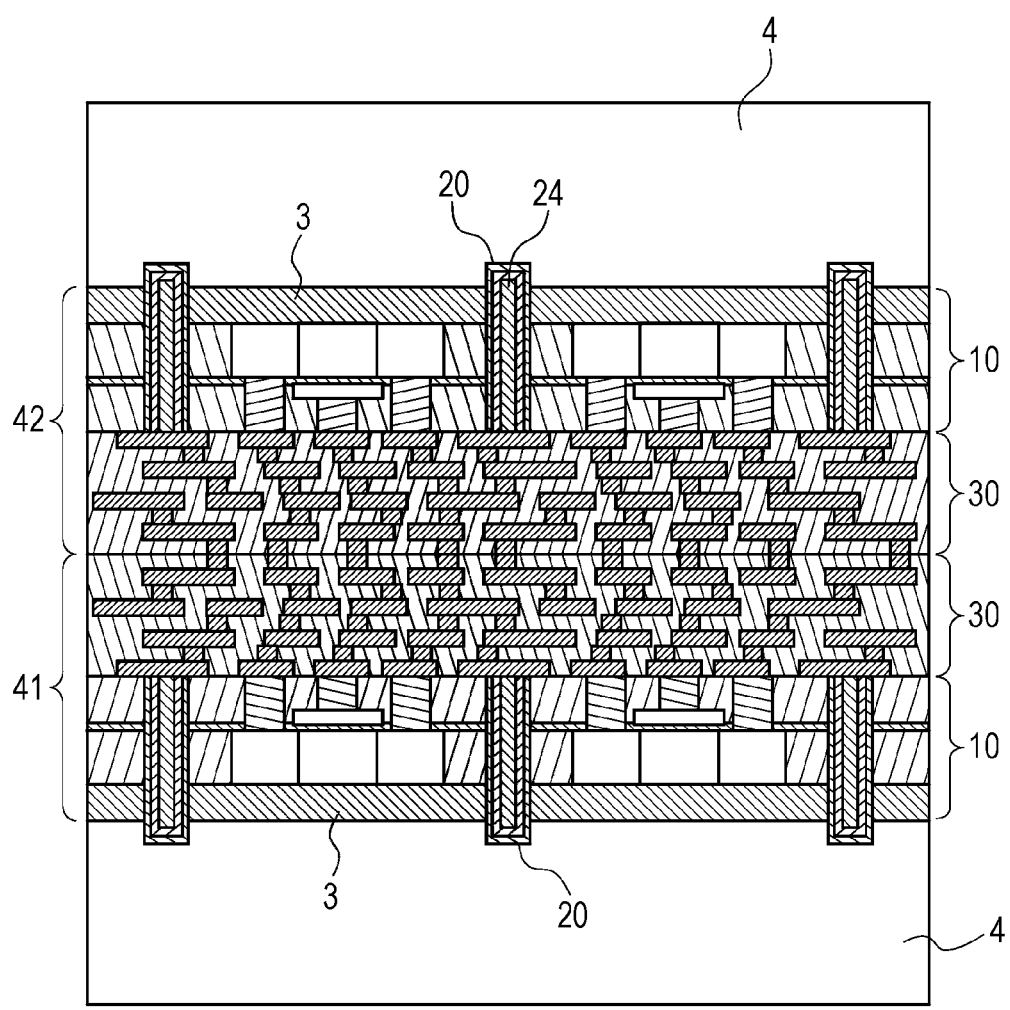
FIG. 3 is a cross-sectional view showing a step of bonding device layers in the method of manufacturing the semiconductor apparatus according to the embodiment of the present disclosure.

FIG. 3 is a cross-sectional view showing a step of bonding a first device layer 41 and a second device layer 42 in the method of manufacturing the semiconductor apparatus according to the embodiment of the present disclosure. As shown in FIG. 3, the multilayer wiring layers 30 of the first device layer 41 and the second device layer 42 are electrically and physically bonded.

As described above, the multilayer wiring layer 30 formed in the second device layer 42 is bonded to the multilayer wiring layer 30 formed in the first device layer 41. This makes it possible to bond the first device layer 41 and the second device layer 42 in a state where the respective Si supporting substrates 4 are not removed. Therefore, it is possible to realize the processing method of the highly accurate and low-cost three-dimensional semiconductor apparatus with less variation in thickness and less risk of cracking.

The first device layer 41 and the second device layer 42 are formed by the method of manufacturing the semiconductor apparatus described above with reference to FIGS. 1 and 2. In order to obtain these device layers, steps up to step d) of forming the multilayer wiring layer 30 shown in FIG. 2B are performed.

The first device layer 41 and the second device layer 42 are joined by a surface activation room temperature bonding method (SAB: Surface Active Bonding). Specifically, after surface activation by Ar ion is performed, the multilayer wiring layers 30 are bonded to each other at a pressure of about 500 g/cm$^2$. This makes it possible to achieve a bonding yield of about 100% of the multilayer wiring layer 30. Further, it is possible to suppress an increase in bonding resistance to a negligibly low level. Furthermore, it is possible to reduce an alignment error between the first device layer 41 and the second device layer 42 to 1 µm or less.

With a bonding method by the SAB, it is possible to bond the first device layer 41 and the second device layer 42 at room temperature. Therefore, the bonding method by the SAB has an advantage that there is no problem of deformation and warpage due to heat. Note that a plasma bonding and the like may be applied as another method for bonding the first device layer 41 and the second device layer 42. However, since heat is necessary in principle for the plasma bonding method, there is a risk of heat deformation and warpage.

After the first device layer 41 and the second device layer 42 are bonded to each other, the Si supporting substrate 4 formed in the second device layer 42 is removed. Step e) of removing the Si supporting substrate 4 of the second device layer 42 can be performed by the various methods described above with reference to FIG. 2C.

Figure 4:
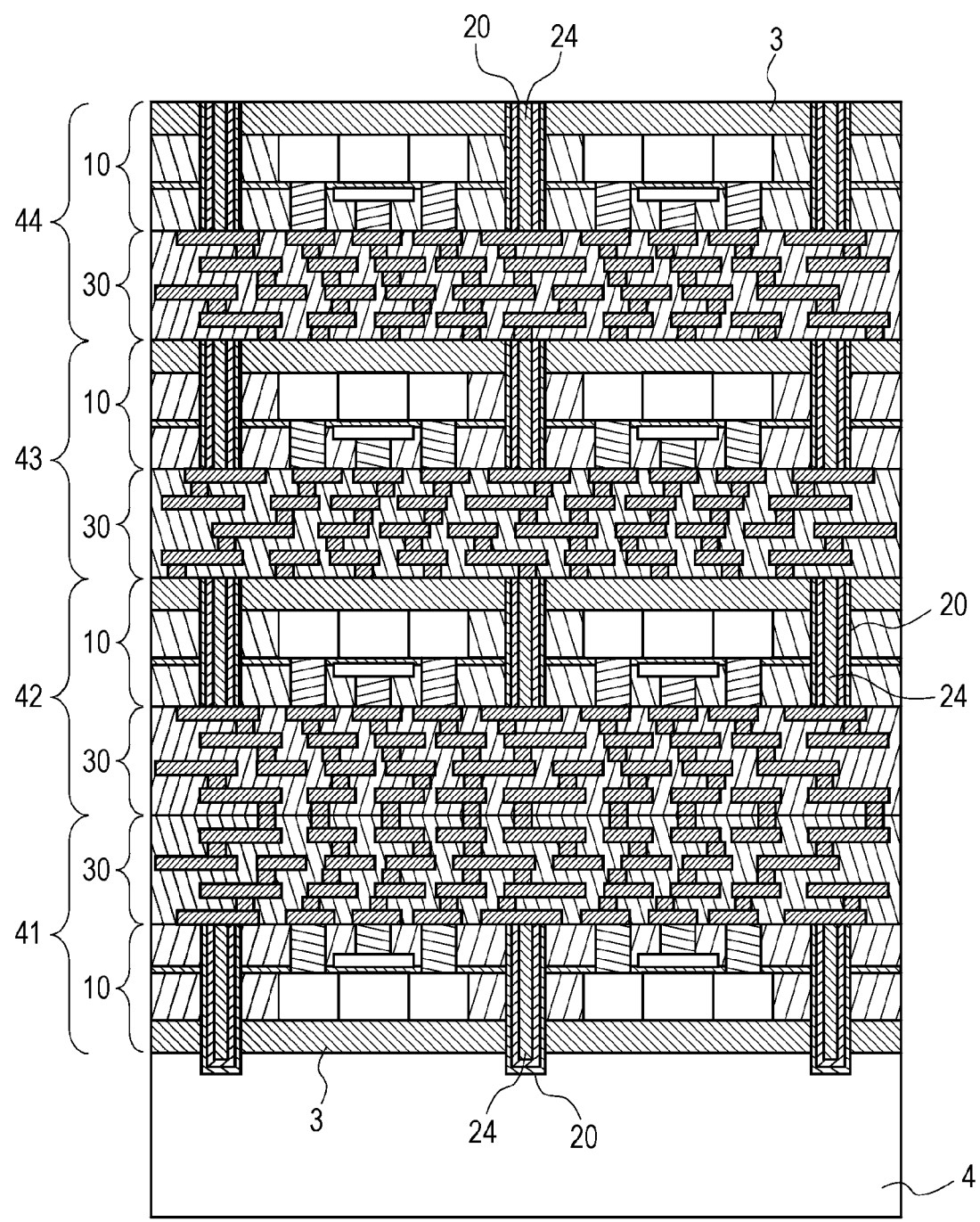
FIG. 4 is a cross-sectional view showing the step of bonding the device layers in the method of manufacturing the semiconductor apparatus according to the embodiment of the present disclosure.

FIG. 4 is a cross-sectional view showing the step of bonding the device layers in the method of manufacturing the semiconductor apparatus according to the present embodiment. FIG. 4 shows a step of further bonding a third device layer 43 and a fourth device layer 44 after the first device layer 41 and the second device layer 42 are bonded by the above-described steps.

As shown in FIG. 4, first, as described above, the Si supporting substrate 4 (see FIG. 3) of the second device layer 42 is completely removed by the grinding method or the like. Thus, the Cu film 24 of the through silicon via 20 is exposed in the second device layer 42.

The third device layer 43 is processed to a state in which the element region layer 10 and the multilayer wiring layer 30 are formed by the above-described manufacturing method as shown in FIG. 2B. Then, as shown in FIG. 4, in the third device layer 43, the multilayer wiring layer 30 is bonded to the element region layer 10 in which the through silicon via 20 of the second device layer 42 is exposed by the SAB method.

After the multilayer wiring layer 30 of the third device layer 43 is bonded to the element region layer 10 of the second device layer 42, the Si supporting substrate (not shown, substantially the same as the Si supporting substrate 4 shown in FIG. 1) of the third device layer 43 is completely removed by the grinding method or the like.

The fourth device layer 44 is also bonded to the third device layer 43 by the same process as described above. That is, the fourth device layer 44 is formed by substantially the same process until the state shown in FIG. 2B is reached. Thereafter, the multilayer wiring layer 30 is bonded to the element region layer 10 of the third device layer 43.

Then, the Si supporting substrate (not shown, substantially the same as the Si supporting substrate 4 shown in FIG. 1) of the fourth device layer 44 is completely removed by the grinding method or the like. Note that a larger number of device layers may further be bonded by repeating the same steps as those described above.

By performing the above steps, after the first device layer 41 to the fourth device layer 44 are bonded, or after still another device layer is bonded as necessary, the Si supporting substrate 4 of the first device layer 41 is finally removed by the grinding method or the like. Thus, the semiconductor apparatus in which the semiconductor device is three-dimensional is manufactured.

As described above, according to the present embodiment, the first device layer 41 formed without using the conventional support wafer to the fourth device layer 44 or even more multilayer device layers can be bonded. This makes it possible to produce the high-performance three-dimensional semiconductor apparatus with high efficiency and low cost.

As described above with reference to FIGS. 1 to 4, with the method of manufacturing the semiconductor apparatus according to the present embodiment, in a process of manufacturing a CMOS device or the like capable of realizing high speed and low power consumption using the insulating isolation Si substrate 1, after a preceding step (a process up to step a) of forming the element region layer 10 including the semiconductor device element 11), step b) and step c) of forming the through silicon via 20 penetrating to the Si active layer 2, the buried insulating layer 3, and a part of the Si supporting substrate 4 thereunder of the insulating isolation Si substrate 1 are performed.

That is, after the preceding step a) of preparing the device such as the CMOS on the thin Si active layer 2 on the buried insulating layer 3 is performed by using the insulating isolation Si substrate 1, step b) of forming the through electrode hole 21 so as to penetrate to the thin Si active layer 2, the buried insulating layer 3, and a part of the Si supporting substrate 4 which is the supporting substrate thereunder is performed. Then, step c) of filling the through electrode hole 21 is performed by sequentially forming the insulating film 22, the barrier film 23, and the Cu film 24 inside the through electrode hole 21 is performed.

Subsequently, step d) of completing the CMOS device is performed by performing a back-end process (step of forming the multilayer wiring layer 30). That is, step d) of forming the multilayer wiring layer 30 is performed by connecting the devices on the device formed in the preceding step a).

Then, step e) of removing the Si supporting substrate 4 on the back surface of the wafer to complete thinning of the device is performed. Specifically, the Si supporting substrate 4 on the back surface side is removed by the method such as grinding until reaching the surface of the buried insulating layer 3 constituting the insulating isolation Si substrate 1. As a result, the through silicon via 20 is exposed.

By performing the series of manufacturing steps, when thinning each device layer, steps of bonding and peeling of the support wafer which have been required in the conventional manufacturing method are eliminated. This makes it possible in principle to eliminate the problem of variation in thickness at the time of bonding, the problem of cracking risk of the device at the time of peeling, and the problem of the cost increase by adding these steps.

The method of manufacturing the semiconductor apparatus according to the present embodiment realizes a three-dimensional structure including various devices (memory, logic, CPU or the like) stacked at wafer level. This makes it possible to provide the semiconductor apparatus with high-density, low power consumption, and high-speed at low cost.

Further, according to the manufacturing method of the present embodiment, it is possible to provide the high-performance semiconductor apparatus as a key device constituting IoT and AI, which are expected to be developed in the future, including various portable terminals currently in use. Therefore, the method of manufacturing the semiconductor apparatus according to the present embodiment can contribute to development of industry.

It is to be noted that the present embodiment is not limited to the above embodiment, and in addition to the above-described embodiment, various modifications can be made to the above-described embodiment without departing from the gist of the present embodiment.

The method of manufacturing the semiconductor apparatus according to the embodiment of the present disclosure may be the following first to fifth methods of manufacturing the semiconductor apparatus.

The first method of manufacturing the semiconductor apparatus includes: a step of forming a semiconductor device element in a Si active layer of an insulating isolation Si substrate in which the Si active layer, a buried insulating layer, and a Si supporting substrate are arranged in this order; a step of forming a plurality of through electrode holes penetrating the Si active layer and the buried insulating layer to reach a partial region of the Si supporting substrate in an element region layer in which the semiconductor device element is formed; a step of forming a through silicon via by sequentially forming an insulating film, a barrier film, and a Cu film in the through electrode hole to completely fill the through electrode hole; a step of forming a multilayer wiring layer including a wiring layer connected to the semiconductor device element on an outer surface of the element region layer in which the through silicon via is formed; and a step of exposing the Cu film of the through silicon via by removing the Si supporting substrate after forming the multilayer wiring layer.

The second method of manufacturing the semiconductor apparatus is the first method of manufacturing the semiconductor apparatus, in which removing of the Si supporting substrate is performed by any one of a grinding method using a diamond grindstone, a combination of the grinding method and a CMP method, and a combination of an etching method and the CMP method.

The third method of manufacturing the semiconductor apparatus is the first or second method of manufacturing the semiconductor apparatus, in which the first device layer formed by performing up to the step of forming the multilayer wiring layer is bonded with the second device layer formed by performing up to the step of forming the multilayer wiring layer using another insulating isolation Si substrate.

The fourth method of manufacturing the semiconductor apparatus is the third method of manufacturing the semiconductor apparatus, wherein the multilayer wiring layer formed in the second device layer is bonded to the multilayer wiring layer formed in the first device layer.

The fifth method of manufacturing the semiconductor apparatus is the third or fourth method of manufacturing the semiconductor apparatus, in which after the second device layer is bonded, a step of exposing the Cu film of the through silicon via formed in the second device layer by removing the Si supporting substrate formed on the second device layer is performed, a third device layer is formed by performing up to a step of forming the multilayer wiring layer using still another insulating isolation Si substrate, and the multilayer wiring layer formed in the third device layer is bonded to the element region layer which is formed in the second device layer and in which the Cu film is exposed.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A method of manufacturing a semiconductor apparatus, comprising the following steps:
    A) forming a semiconductor device element in a Si active layer of an insulating isolation Si substrate including the Si active layer, a buried insulating layer, and a Si supporting substrate arranged in this order;
    B) forming a plurality of through electrode holes penetrating the Si active layer and the buried insulating layer to reach a partial region of the Si supporting substrate in an element region layer including the formed semiconductor device element;
    C) forming a through silicon via by sequentially forming an insulating film, a barrier film, and a Cu film inside the through electrode hole to completely fill the through electrode hole;
    D) forming a multilayer wiring layer including a wiring layer connected to the semiconductor device element on an outer surface of the element region layer in which the through silicon via is formed; and
    E) exposing the Cu film of the through silicon via by removing the Si supporting substrate after forming the multilayer wiring layer,
    wherein a first device layer obtained after step D) is bonded with a second device layer obtained after step D) using another insulating isolation Si substrate, and step E) is performed in the second device layer bonded to the first device layer, a third device layer obtained after step D) is formed using still another insulating isolation Si substrate, and the multilayer wiring layer of the third device layer is bonded to the element region layer which is formed in the second device layer and in which the Cu film is exposed.

2. The method of manufacturing the semiconductor apparatus according to claim 1, wherein removing of the Si supporting substrate in step E) is performed by any one of a grinding method using a diamond grindstone, a combination of the grinding method and a CMP method, and a combination of an etching method and the CMP method.

3. The method of manufacturing the semiconductor apparatus according to claim 1, wherein the multilayer wiring layer formed in the second device layer is bonded to the multilayer wiring layer formed in the first device layer.

4. A method of manufacturing a semiconductor apparatus, comprising the following steps:
    A) forming a semiconductor device element in a Si active layer of an insulating isolation Si substrate including the Si active layer, a buried insulating layer, and a Si supporting substrate arranged in this order;
    B) forming a plurality of through electrode holes penetrating the Si active layer and the buried insulating layer to reach a partial region of the Si supporting substrate in an element region layer including the formed semiconductor device element;

C) forming a through silicon via by sequentially forming an insulating film, a barrier film, and a Cu film inside the through electrode hole to completely fill the through electrode hole;

D1) forming a multilayer wiring layer to form a device layer, the multilayer wiring layer including a wiring layer connected to the semiconductor device element on an outer surface of the element region layer in which the through silicon via is formed;

D2) physically and directly bonding the multilayer wiring layer in the first device layer with a multilayer wiring layer in a second device layer obtained after step D1) using another insulating isolation Si substrate; and E) exposing the Cu film of the through silicon via by removing the Si supporting substrate after forming the multilayer wiring layer on the outer surface of the element region layer.

5. The method of manufacturing the semiconductor apparatus according to claim 4, wherein removing of the Si supporting substrate in step E) is performed by any one of a grinding method using a diamond grindstone, a combination of the grinding method and a CMP method, and a combination of an etching method and the CMP method.

6. The method of manufacturing the semiconductor apparatus according to claim 4, wherein step E) is performed in the second device layer bonded to the first device layer, a third device layer obtained after step D) is formed using still another insulating isolation Si substrate, and the multilayer wiring layer of the third device layer is bonded to the element region layer which is formed in the second device layer and in which the Cu film is exposed.

7. The method of manufacturing the semiconductor apparatus according to claim 4, wherein the multilayer wiring layer in the first device layer is bonded with the multilayer wiring layer in the second device layer by a surface activation room temperature bonding method.

8. A method of manufacturing a semiconductor apparatus, comprising the following steps:

A) forming a semiconductor device element in a Si active layer of an insulating isolation Si substrate including the Si active layer, a buried insulating layer, and a Si supporting substrate arranged in this order;

B) forming a plurality of through electrode holes penetrating the Si active layer and the buried insulating layer to reach a partial region of the Si supporting substrate in an element region layer including the formed semiconductor device element;

C) forming a through silicon via by sequentially forming an insulating film, a barrier film, and a Cu film inside the through electrode hole to completely fill the through electrode hole;

D1) forming a multilayer wiring layer to form a device layer, the multilayer wiring layer including a wiring layer connected to the semiconductor device element on an outer surface of the element region layer in which the through silicon via is formed;

D2) physically and directly bonding the multilayer wiring layer in the first device layer with a multilayer wiring layer in a second device layer obtained after step D1) using another insulating isolation Si substrate;

E) exposing a Cu film of a through silicon via in the second device by removing a Si supporting substrate;

physically and directly bonding the Cu film of the through silicon via in the second device with a multilayer wiring layer in a third device layer obtained after step D1) using the another insulating isolation Si substrate;

exposing a Cu film of a through silicon via in the third device by removing a Si supporting substrate; and physically and directly bonding the Cu film of the through silicon via in the third device with a multilayer wiring layer in a fourth device layer obtained after step D1) using the another insulating isolation Si substrate.

* * * * *